US012401142B2

(12) United States Patent
Otsubo

(10) Patent No.: US 12,401,142 B2
(45) Date of Patent: Aug. 26, 2025

(54) CIRCUIT MODULE

(71) Applicant: Murata Manufacturing Co., Ltd., Nagaokakyo (JP)

(72) Inventor: Yoshihito Otsubo, Nagaokakyo (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 207 days.

(21) Appl. No.: 18/475,392

(22) Filed: Sep. 27, 2023

(65) Prior Publication Data

US 2024/0136739 A1 Apr. 25, 2024
US 2024/0235071 A9 Jul. 11, 2024

(30) Foreign Application Priority Data

Oct. 19, 2022 (JP) ................................ 2022-167401

(51) Int. Cl.
*H01R 12/52* (2011.01)
*H05K 1/18* (2006.01)

(52) U.S. Cl.
CPC ............ *H01R 12/52* (2013.01); *H05K 1/181* (2013.01); *H05K 2201/042* (2013.01); *H05K 2201/10234* (2013.01); *H05K 2201/10318* (2013.01); *H05K 2201/10522* (2013.01); *H05K 2201/10545* (2013.01)

(58) Field of Classification Search
CPC ...................................................... H01R 12/52
USPC ......................................................... 174/255
See application file for complete search history.

(56) References Cited

U.S. PATENT DOCUMENTS 11,133,244 B2 9/2021 Yeh
2009/0135575 A1* 5/2009 Kajiki .................... H05K 1/144 361/784
2015/0255433 A1* 9/2015 Daizo .................. H01L 25/105 257/737
2020/0035603 A1* 1/2020 Rubin ..................... H01L 24/16
2023/0089258 A1* 3/2023 Hoang .................. H05K 7/142 361/787

FOREIGN PATENT DOCUMENTS

JP 2015-170725 A 9/2015
JP 2021-532578 A 11/2021

* cited by examiner

*Primary Examiner* — Stanley Tso
(74) *Attorney, Agent, or Firm* — McDonald Hopkins LLC

(57) ABSTRACT

A circuit module includes an upper circuit board, a lower circuit board, a first conductor member, a second conductor member, and a first component. The upper circuit board has a first upper main surface and a first lower main surface. The lower circuit board has a second upper main surface and a second lower main surface, is disposed below the upper circuit board, and overlaps the upper circuit board as viewed in the downward direction. The first component is mounted on the first lower main surface or the second upper main surface. The first conductor member is a metal pin and is connected to the first lower main surface. The second conductor member is a metal pin and is connected to the second upper main surface. The second conductor member is electrically connected to the first conductor member.

9 Claims, 9 Drawing Sheets

CIRCUIT MODULE

CROSS REFERENCE TO RELATED APPLICATION

This application claims priority from Japanese Patent Application No. 2022-167401 filed on Oct. 19, 2022. The content of this application is incorporated herein by reference in its entirety.

BACKGROUND OF THE DISCLOSURE

1. Field of the Disclosure

The present disclosure relates to an electronic device including an upper circuit board and a lower circuit board.

2. Description of the Related Art

As a disclosure related to a conventional circuit module, for example, a semiconductor device package described in U.S. Pat. No. 11,133,244 is known. This composite substrate includes a first substrate, a second substrate, and a conductive structure. The first substrate is disposed on the second substrate. The conductive structure is a pin extending along an up-down axis. The conductive structure is mounted on a lower main surface of the first substrate and an upper main surface of the second substrate. Due to this, the conductive structure electrically connects the first substrate and the second substrate.

BRIEF SUMMARY OF THE DISCLOSURE

Regarding the semiconductor device package described in U.S. Pat. No. 11,133,244, there is a demand for mounting more components between the first substrate and the second substrate. In this case, an interval between the first substrate and the second substrate increases. Since the conductive structure becomes long, the possibility that the conductive structure falls becomes high.

A possible benefit of the present disclosure is to provide a circuit module capable of mounting more components between an upper circuit board and a lower circuit board.

A circuit module according to an embodiment of the present disclosure includes: an upper circuit board, a lower circuit board, a first conductor member, a second conductor member, and a first component, in which the upper circuit board has a first upper main surface and a first lower main surface, the lower circuit board has a second upper main surface and a second lower main surface, is disposed below the upper circuit board, and overlaps the upper circuit board as viewed in a downward direction, the first component is mounted on the first lower main surface or the second upper main surface, the first conductor member is a metal pin or a solder bump, and is connected to the first lower main surface, the second conductor member is a metal pin and is connected to the second upper main surface, the second conductor member is electrically connected to the first conductor member, and a length of the second conductor member in an up-down direction is longer than a maximum value of a length of the second conductor member in an orthogonal direction orthogonal to the up-down direction.

According to the circuit module according to the present disclosure, more components can be mounted between the upper circuit board and the lower circuit board.

DETAILED DESCRIPTION OF THE DISCLOSURE

Embodiments

[Structure of Circuit Module 10]

Figure 1:
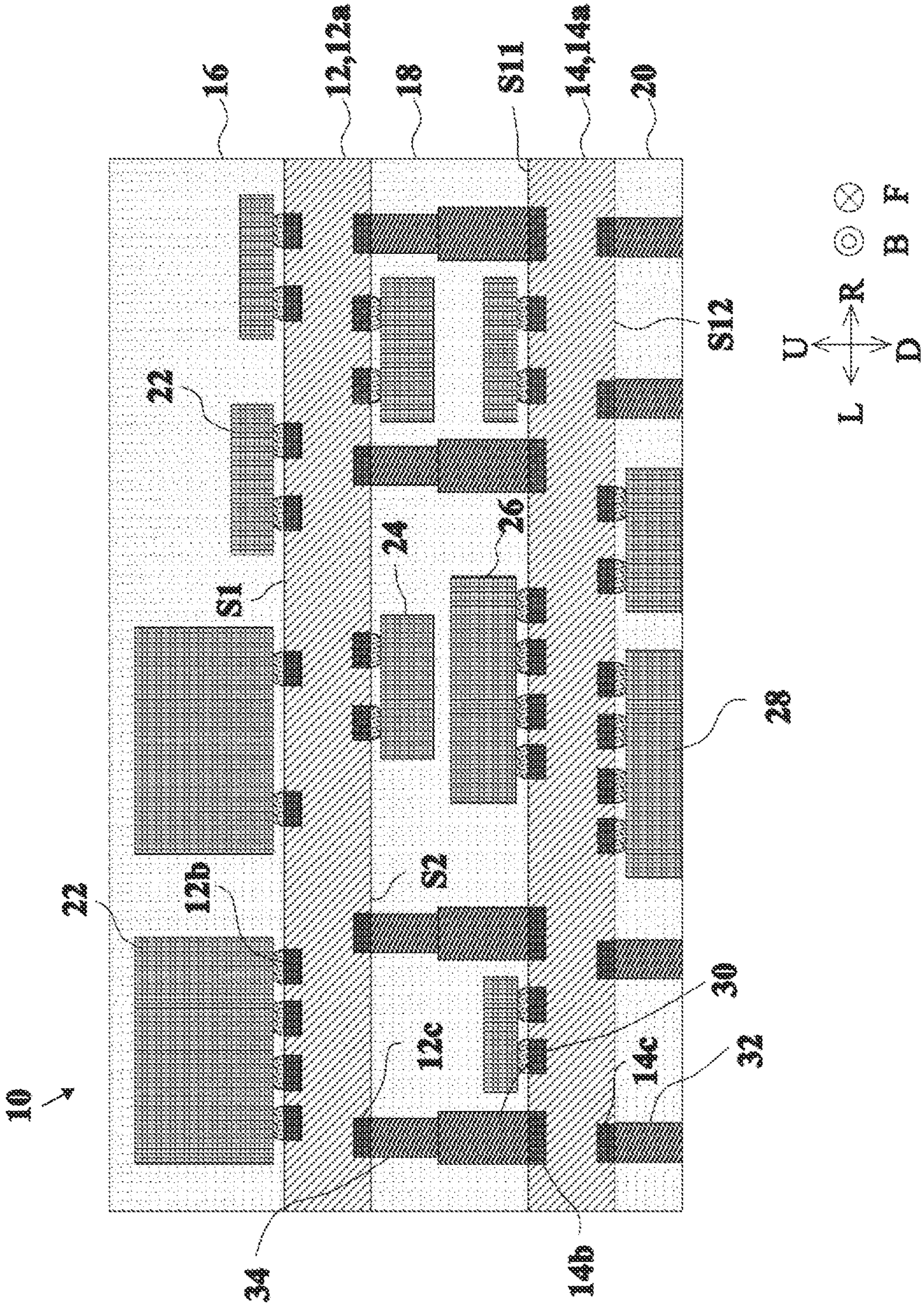
FIG. 1 is a cross-sectional view of a circuit module 10.

The structure of the circuit module 10 according to an embodiment of the present disclosure will be described below with reference to the drawings. FIG. 1 is a cross-sectional view of a circuit module 10. In FIG. 1, reference signs are given only to a component 22, a first component 24, a second component 26, a component 28, a first conductor member 34, a second conductor member 30, a third conductor member 32, a mounting electrode 12*b*, a mounting electrode 12*c*, a mounting electrode 14*b*, and a mounting electrode 14*c* that are representative among a plurality of the components 22, a plurality of the first components 24, a plurality of the second components 26, a plurality of the components 28, a plurality of the first conductor members 34, a plurality of the second conductor members 30, a plurality of the third conductor members 32, a plurality of the mounting electrodes 12*b*, a plurality of the mounting electrodes 12*c*, a plurality of the mounting electrodes 14*b*, and a plurality of the mounting electrodes 14*c*.

Hereinafter, as illustrated in FIG. 1, a direction from an upper circuit board 12 toward a lower circuit board 14 is defined as a downward direction of an up-down axis that coincides with an up-down direction. Axes orthogonal to the up-down axis are defined as a front-back axis and a left-right axis. The up-down axis, the front-back axis, and the left-right axis are orthogonal to one another. The front-back axis coincides with an axis extending along an axis perpendicular to the drawing sheet surface of FIG. 1. The left-right axis coincides with the left-right axis of the drawing sheet surface of FIG. 1. However, the up-down axis, the left-right axis, and the front-back axis in the present specification are directions defined for convenience of description, and need not coincide with the up-down axis, the left-right axis, and the front-back axis in use of the circuit module 10. In each drawing, the upward direction and the downward direction may be interchanged, the left direction and the right direction may be interchanged, and the front direction and the back direction may be interchanged.

The circuit module 10 is used for a wireless communication terminal such as a smartphone. The circuit module 10 includes, for example, an integrated circuit (IC) such as a power amplifier (PA) or a low noise amplifier (LNA), and a coil, a capacitor, and the like. The coil, the capacitor, and the like are impedance matching circuit elements for each IC. The circuit module 10 has a cuboid shape. As illustrated in FIG. 1, the circuit module 10 includes the upper circuit board 12, the lower circuit board 14, a sealing resin 16, a sealing resin 18, a sealing resin 20, a plurality of components 22, a plurality of first components 24, a plurality of second components 26, a plurality of components 28, a plurality of first conductor members 34, a plurality of second conductor members 30, and a plurality of third conductor members 32.

As illustrated in FIG. 1, the upper circuit board 12 has a first upper main surface S1 and a first lower main surface S2. More specifically, the upper circuit board 12 includes a board body 12*a*, the plurality of mounting electrodes 12*b*, and the plurality of mounting electrodes 12*c*. The board body 12*a* has a plate shape having an upper main surface and a lower main surface. The board body 12*a* has a rectangular shape having two sides along the front-back axis and two sides extending along the left-right axis as viewed in the downward direction. The board body 12*a* has a multilayer structure. An electric circuit not illustrated is provided inside the board body 12*a*. The material of the board body 12*a* is, for example, a glass epoxy or a low temperature co-fired ceramics (LTCC) board, or the like.

As illustrated in FIG. 1, the plurality of mounting electrodes 12*b* are provided on the upper main surface of the board body 12*a*. The plurality of mounting electrodes 12*c* are provided on the lower main surface of the board body 12*a*. The plurality of mounting electrodes 12*b* and the plurality of mounting electrodes 12*c* have a rectangular shape or a circular shape as viewed in the downward direction. The plurality of mounting electrodes 12*b* and the plurality of mounting electrodes 12*c* have a structure in which, for example, Ni plating and Au plating are applied to the surface of a copper-thick film electrode.

Here, the first upper main surface S1 of the upper circuit board 12 includes the upper main surface of the board body 12*a* and the plurality of mounting electrodes 12*b*. The first lower main surface S2 of the upper circuit board 12 includes the lower main surface of the board body 12*a* and the plurality of mounting electrodes 12*c*.

As illustrated in FIG. 1, the lower circuit board 14 has a second upper main surface S11 and a second lower main surface S12. More specifically, the lower circuit board 14 includes a board body 14*a*, the plurality of mounting electrodes 14*b*, and the plurality of mounting electrodes 14*c*. The board body 14*a* has a plate shape having an upper main surface and a lower main surface. The board body 14*a* has a rectangular shape having two sides extending along the front-back axis and two sides extending along the left-right axis as viewed in the downward direction. The board body 14*a* has a multilayer structure. An electric circuit not illustrated is provided inside the board body 14*a*. The material of the board body 14*a* is, for example, a glass epoxy or an LTCC board, or the like.

As illustrated in FIG. 1, the plurality of mounting electrodes 14*b* are provided on the upper main surface of the board body 14*a*. The plurality of mounting electrodes 14*c* are provided on the lower main surface of the board body 14*a*. The plurality of mounting electrodes 14*b* and the plurality of mounting electrodes 14*c* have a rectangular shape or a circular shape as viewed in the up-down direction. The plurality of mounting electrodes 14*b* and the plurality of mounting electrodes 14*c* have a structure in which, for example, Ni plating and Au plating are applied to the surface of a copper thin film.

Here, the second upper main surface S11 of the lower circuit board 14 includes the upper main surface of the board body 14*a* and the plurality of mounting electrodes 14*b*. The second lower main surface S12 of the lower circuit board 14 includes the lower main surface of the board body 14*a* and the plurality of mounting electrodes 14*c*.

As illustrated in FIG. 1, the lower circuit board 14 as described above is disposed below the upper circuit board 12. The lower circuit board 14 overlaps the upper circuit board 12 as viewed in the downward direction. As viewed in the downward direction, the entire outer edge of the lower circuit board 14 overlaps the entire outer edge of the upper circuit board 12.

The plurality of first conductor members 34 are metal pins. The plurality of first conductor members 34 have a rod shape extending along the up-down axis. The length in the up-down direction of the plurality of first conductor members 34 is longer than the maximum value of the length of the plurality of first conductor members 34 in the orthogonal direction orthogonal to the up-down direction. The plurality of first conductor members 34 are connected to the first lower main surface S2. Specifically, each of the upper ends of the plurality of first conductor members 34 is fixed to the plurality of mounting electrodes 12*c* by soldering. The material of the plurality of first conductor members 34 is, for example, copper.

The plurality of second conductor members 30 are metal pins. The plurality of second conductor members 30 have a rod shape extending along the up-down axis. Therefore, the length in the up-down direction of the plurality of second conductor members 30 is longer than the maximum value of the length of the plurality of second conductor members 30 in the orthogonal direction orthogonal to the up-down direction. Furthermore, the plurality of second conductor members 30 are thicker than the plurality of first conductor members 34. That is, the maximum value of the length of the plurality of second conductor members 30 in the orthogonal direction orthogonal to the up-down direction is larger than the maximum value of the length of the plurality of first conductor members 34 in the orthogonal direction orthogonal to the up-down direction. In the present embodiment, the area of the upper ends of the plurality of second conductor members 30 is larger than the area of the lower ends of the plurality of first conductor members 34. The plurality of second conductor members 30 are connected to the second upper main surface S11. Specifically, each of the lower ends of the plurality of second conductor members 30 is fixed to the plurality of mounting electrodes 14*b* by soldering.

Furthermore, the plurality of second conductor members 30 are disposed below the plurality of first conductor members 34. The upper ends of the plurality of second conductor members 30 are in contact with the lower ends of the plurality of first conductor members 34. Due to this, the plurality of second conductor members 30 are electrically connected to the plurality of first conductor members 34. The material of the plurality of second conductor members 30 is, for example, copper. The plurality of first conductor members 34 and the plurality of second conductor members 30 having the above structure electrically connect the upper circuit board 12 and the lower circuit board 14.

The plurality of third conductor members 32 are metal pins. The plurality of third conductor members 32 have a rod shape extending along the up-down axis. The length in the up-down direction of the plurality of third conductor members 32 is longer than the maximum value of the length of the plurality of third conductor members 32 in the orthogonal direction orthogonal to the up-down direction. The plurality of third conductor members 32 are connected to the second lower main surface S12. Specifically, each of the upper ends of the plurality of third conductor members 32 is fixed to the mounting electrode 14*c* of the lower circuit board 14 by soldering. The plurality of third conductor members 32 come into contact with a mounting electrode of a motherboard when the circuit module 10 is mounted on the motherboard. The material of the plurality of third conductor members 32 is, for example, copper.

As illustrated in FIG. 1, the plurality of components 22 are mounted on the first upper main surface S1 of the upper circuit board 12. More specifically, the plurality of components 22 are mounted on the plurality of mounting electrodes 12*b*.

As illustrated in FIG. 1, the plurality of first components 24 are mounted on the first lower main surface S2 of the upper circuit board 12. More specifically, the plurality of first components 24 are mounted on the plurality of mounting electrodes 12*c*.

As illustrated in FIG. 1, the plurality of second components 26 are mounted on the second upper main surface S11 of the lower circuit board 14. More specifically, the plurality of second components 26 are mounted on the plurality of mounting electrodes 14*b*.

As illustrated in FIG. 1, the plurality of components 28 are mounted on the second lower main surface S12 of the lower circuit board 14. More specifically, the plurality of components 28 are mounted on the plurality of mounting electrodes 14*c*. The plurality of components 22, the plurality of first components 24, the plurality of second components 26, and the plurality of components 28 as described above are electronic components such as chip coils, chip capacitors, and semiconductor integrated circuits.

As illustrated in FIG. 1, the sealing resin 18 covers the first lower main surface S2 of the upper circuit board 12 and the second upper main surface S11 of the lower circuit board 14. The sealing resin 18 is provided between the upper circuit board 12 and the lower circuit board 14 so as to cover the surfaces of the plurality of first conductor members 34, the plurality of second conductor members 30, the plurality of first components 24, and the plurality of second components 26. The sealing resin 18 has a cuboid shape. As viewed in the downward direction, the entire outer edge of the sealing resin 18 overlaps the entire outer edge of the upper circuit board 12 and the entire outer edge of the lower circuit board 14.

As illustrated in FIG. 1, the sealing resin 16 covers the first upper main surface S1 of the upper circuit board 12. The sealing resin 16 covers the surfaces of the plurality of components 22. The sealing resin 16 has a cuboid shape. As viewed in the up-down direction, the entire outer edge of the sealing resin 16 overlaps the entire outer edge of the upper circuit board 12 and the entire outer edge of the lower circuit board 14.

As illustrated in FIG. 1, the sealing resin 20 covers the second lower main surface S12 of the lower circuit board 14. The sealing resin 20 covers the surfaces of the plurality of third conductor members 32 and the plurality of components 28. However, the lower ends of the plurality of third conductor members 32 and the lower surfaces of the plurality of components 28 are exposed from the sealing resin 20. The sealing resin 20 has a cuboid shape. As viewed in the up-down direction, the entire outer edge of the sealing resin 20 overlaps the entire outer edge of the upper circuit board 12 and the entire outer edge of the lower circuit board 14. The materials of the sealing resin 18, the sealing resin 16, and the sealing resin 20 as described above are, for example, epoxy resins.

Figure 2:
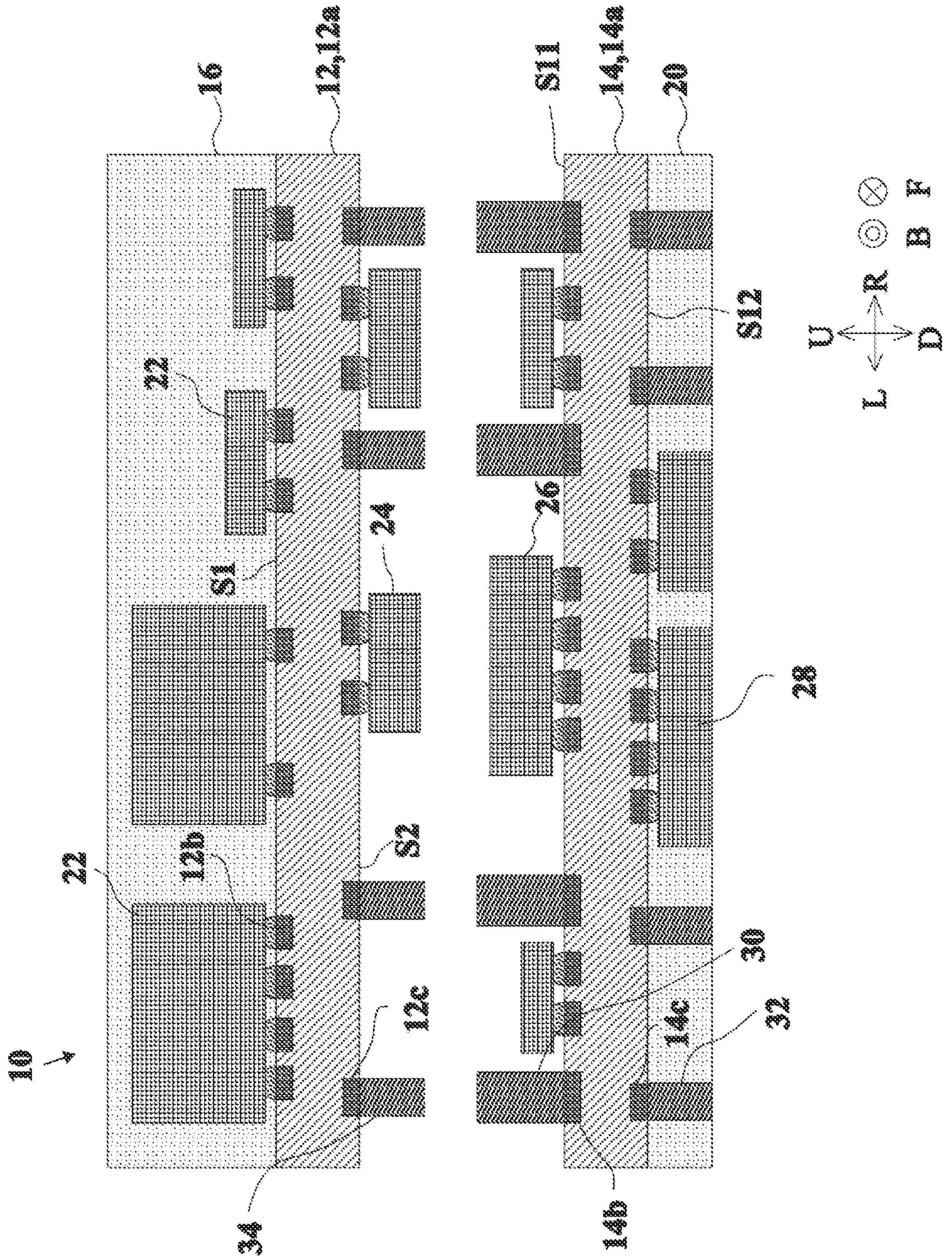
FIG. 2 is a cross-sectional view illustrating a manufacturing process of the circuit module 10.
Figure 3:
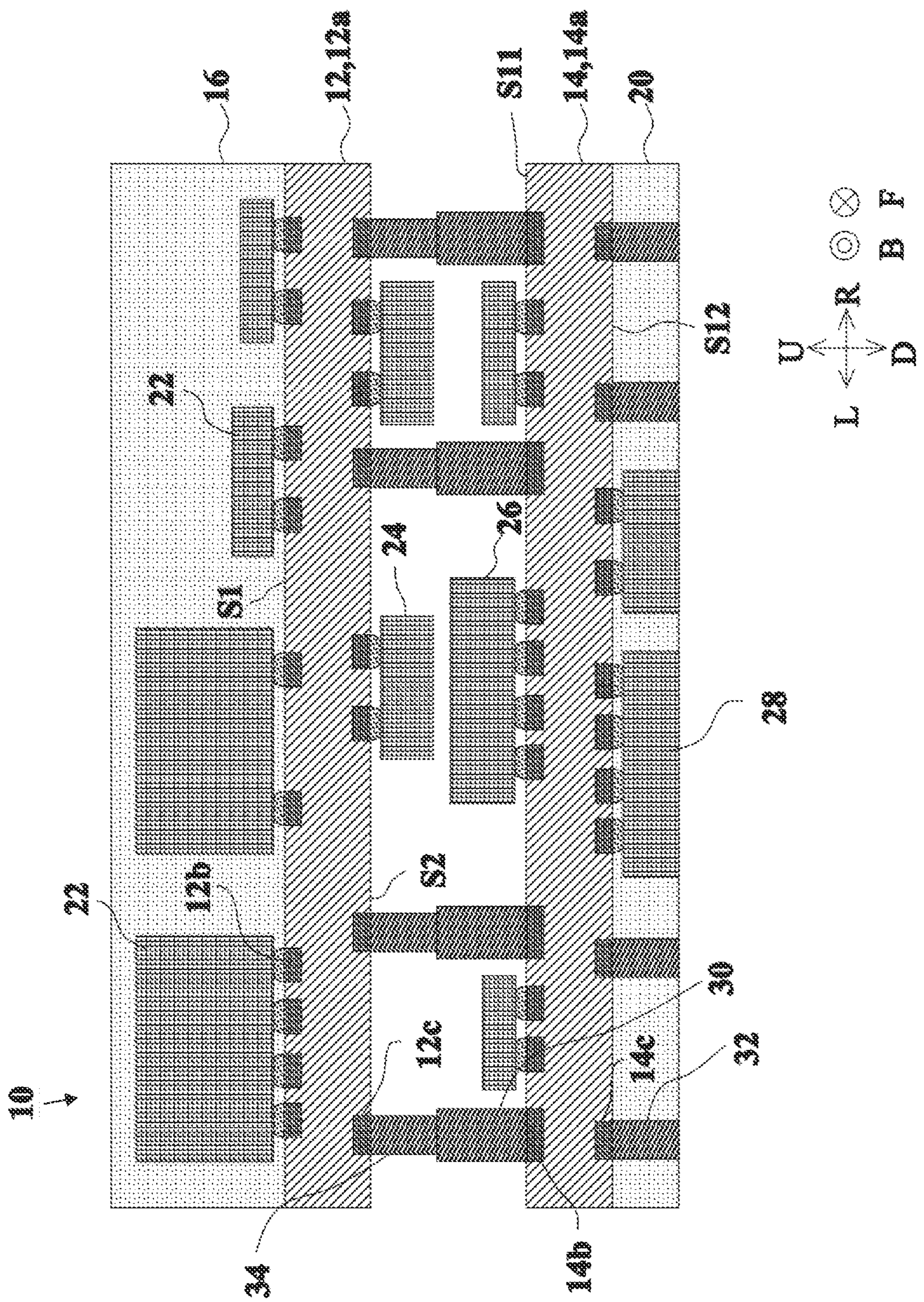
FIG. 3 is a cross-sectional view illustrating a manufacturing process of the circuit module 10.

The circuit module 10 as described above is produced by the following procedure. FIGS. 2 and 3 are cross-sectional views illustrating the manufacturing process of the circuit module 10.

First, as illustrated in FIG. 2, the plurality of first conductor members 34 are mounted on the plurality of mounting electrodes 12*c*. The plurality of second conductor members 30 are mounted on the plurality of mounting electrodes 14*b*.

Next, as illustrated in FIG. 3, the lower ends of the plurality of first conductor members 34 are brought into contact with the upper ends of the plurality of second conductor members 30. Then, as illustrated in FIG. 1, the sealing resin 18 is injected between the upper circuit board 12 and the lower circuit board 14.

Effects

According to the circuit module 10, more components can be mounted between the upper circuit board 12 and the lower circuit board 14. More specifically, regarding the semiconductor device package described in U.S. Pat. No. 11,133,244, there is a demand for mounting more components between the first substrate and the second substrate. In this case, an interval between the first substrate and the second substrate increases. In this case, since the conductive structure becomes long, the possibility that the conductive structure falls becomes high.

Therefore, in the circuit module 10, the plurality of first conductor members 34 are connected to the first lower main surface S2. The plurality of second conductor members 30 are connected to the second upper main surface S11. Each of the plurality of second conductor members 30 is electrically connected to the plurality of first conductor members 34. Due to this, the plurality of first conductor members 34 and the plurality of second conductor members 30 electrically connect the upper circuit board 12 and the lower circuit board 14. Thus, the member electrically connecting the upper circuit board 12 and the lower circuit board 14 is divided into the plurality of first conductor members 34 and the plurality of second conductor members 30, whereby the length of the plurality of first conductor members 34 and the length of the plurality of second conductor members 30 are shortened. As a result, the plurality of first conductor members 34 and the plurality of second conductor members 30 become less likely to fall. Therefore, in the circuit module 10, since the interval between the upper circuit board 12 and the lower circuit board 14 can be increased, more components can be mounted between the upper circuit board 12 and the lower circuit board 14.

According to the circuit module 10, more components can be mounted between the upper circuit board 12 and the lower circuit board 14 also for the following reason. More specifically, the length of the plurality of second conductor members 30 in the up-down direction is longer than the maximum value of the length of the plurality of second conductor members 30 in the orthogonal direction orthogonal to the up-down direction. Due to this, the ratio of the plurality of second conductor members 30 to the second upper main surface S11 decreases. As a result, many components can be mounted on the second upper main surface S11. As described above, according to the circuit module 10, more components can be mounted between the upper circuit board 12 and the lower circuit board 14.

According to the circuit module 10, more components can be mounted between the upper circuit board 12 and the lower circuit board 14 also for the following reason. More specifically, the length of the plurality of first conductor members 34 in the up-down direction is longer than the maximum value of the length of the plurality of first conductor members 34 in the orthogonal direction orthogonal to the up-down direction. Due to this, the ratio of the plurality of first conductor members 34 to the first lower main surface S2 decreases. As a result, many components can be mounted on the first lower main surface S2. As described above, according to the circuit module 10, more components can be mounted between the upper circuit board 12 and the lower circuit board 14.

In the circuit module 10, the plurality of second conductor members 30 are thicker than the plurality of first conductor members 34. That is, the maximum value of the length of the plurality of second conductor members 30 in the orthogonal direction orthogonal to the up-down direction is larger than the maximum value of the length of the plurality of first conductor members 34 in the orthogonal direction orthogonal to the up-down direction. Due to this, even if the plurality of first conductor members 34 are shifted in the front direction, the back direction, the left direction, or the right direction with respect to the plurality of second conductor members 30, the plurality of first conductor members 34 and the plurality of second conductor members 30 are easily connected.

First Modification

Figure 4:
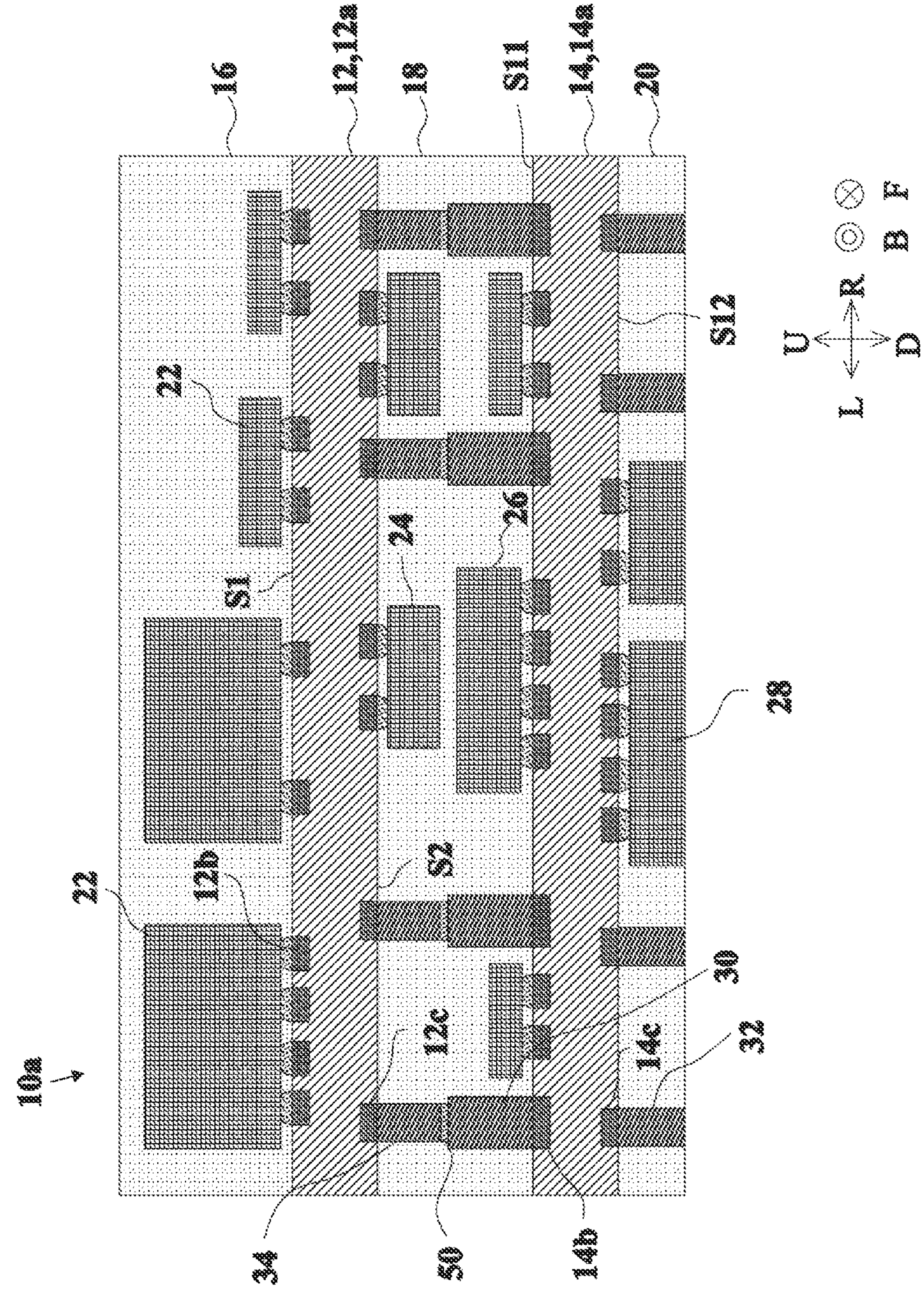
FIG. 4 is a cross-sectional view of a circuit module 10*a;*

Hereinafter, the circuit module 10*a* according to a first modification will be described with reference to the drawings. FIG. 4 is a cross-sectional view of a circuit module 10*a*.

The circuit module 10*a* is different from the circuit module 10 in including a plurality of solders 50. The plurality of solders 50 are disposed between the plurality of first conductor members 34 and the plurality of second conductor members 30. Due to this, the plurality of solders 50 fix the plurality of first conductor members 34 and the plurality of second conductor members 30, and electrically connect the plurality of first conductor members 34 and the plurality of second conductor members 30. The other structures of the circuit module 10*a* are the same as those of the circuit module 10, and thus description will be omitted. The circuit module 10*a* has the same functions and effects as those of the circuit module 10.

Second Modification

Figure 5:
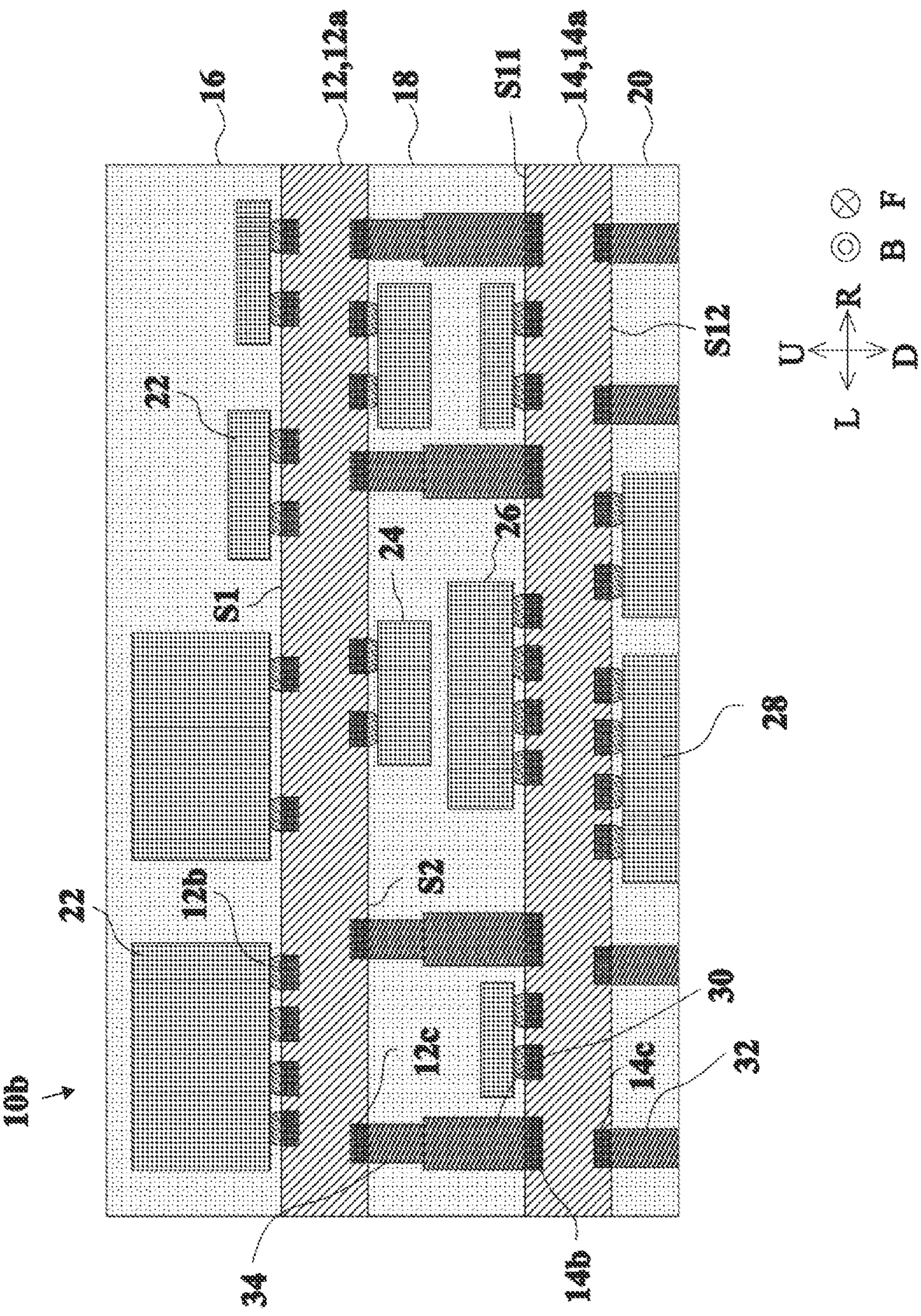
FIG. 5 is a cross-sectional view of a circuit module 10*b;*

Hereinafter, the circuit module 10*b* according to a second modification will be described with reference to the drawings. FIG. 5 is a cross-sectional view of a circuit module 10*b*.

The circuit module 10*b* is different from the circuit module 10 in that the plurality of first conductor members 34 are short and the plurality of second conductor members 30 are long. Thus, in the circuit module 10*b*, the length, in the up-down direction, of the plurality of first conductor members 34 that are thin is shorter than the length, in the up-down direction, of the plurality of second conductor members 30 that are thick. The plurality of thin first conductor members 34 easily fall. Therefore, since the height of the plurality of thin first conductor members 34 in the up-down direction is low, the plurality of first conductor members 34 are less likely to fall. The other structures of the circuit module 10*b* are the same as those of the circuit module 10, and thus description will be omitted. The circuit module 10*b* has the same functions and effects as those of the circuit module 10.

Third Modification

Figure 6:
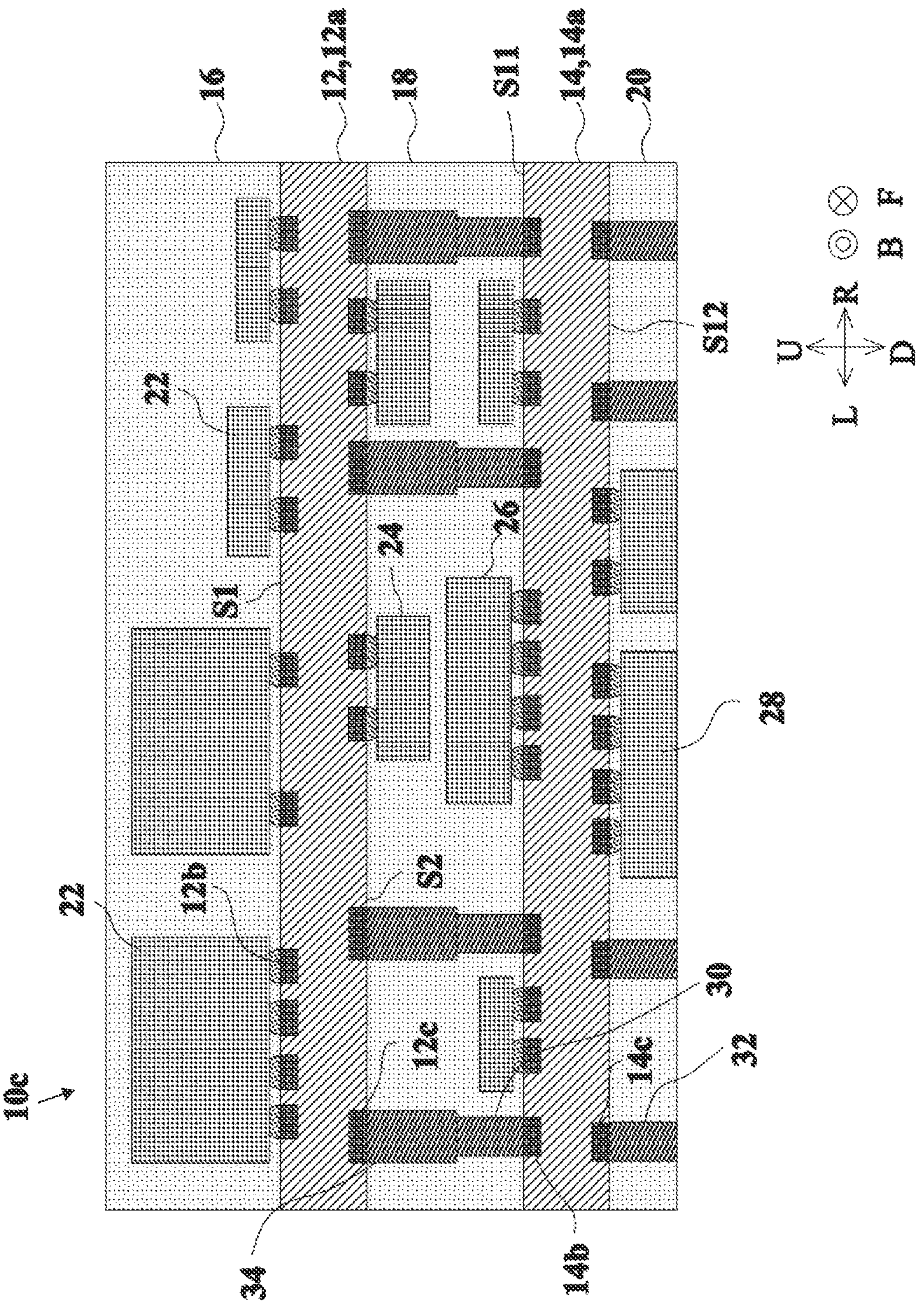
FIG. 6 is a cross-sectional view of a circuit module 10*c;*

Hereinafter, the circuit module 10*c* according to a third modification will be described with reference to the drawings. FIG. 6 is a cross-sectional view of a circuit module 10*c*.

The circuit module 10*c* is different from the circuit module 10 in that the plurality of first conductor members 34 are thicker than the plurality of second conductor members 30. That is, the maximum value of the length of the plurality of first conductor members 34 in the orthogonal direction orthogonal to the up-down direction is larger than the maximum value of the length of the plurality of second conductor members 30 in the orthogonal direction orthogonal to the up-down direction. The other structures of the circuit module 10*c* are the same as those of the circuit module 10, and thus description will be omitted. The circuit module 10*c* has the same functions and effects as those of the circuit module 10.

Fourth Modification

Figure 7:
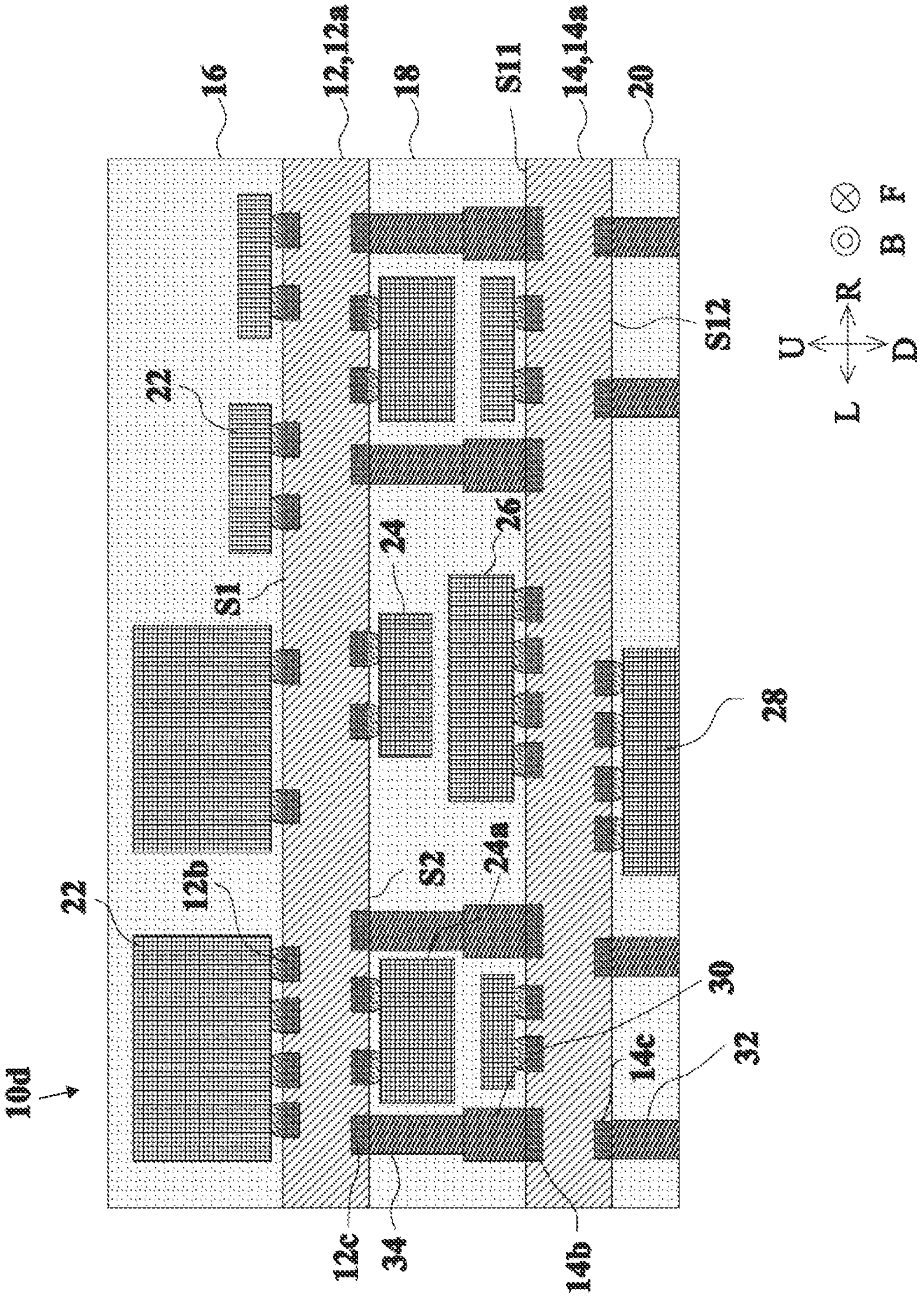
FIG. 7 is a cross-sectional view of a circuit module 10*d;*

Hereinafter, the circuit module 10*d* according to a fourth modification will be described with reference to the drawings. FIG. 7 is a cross-sectional view of a circuit module 10*d*.

The circuit module 10*d* is different from the circuit module 10 in that the plurality of first conductor members 34 are long and the plurality of second conductor members 30 are short. More specifically, in the circuit module 10*d*, the length of the plurality of thin first conductor members 34 in the up-down direction is longer than the length of the plurality of thick second conductor members 30 in the up-down direction. The height of the first component 24*a* in the up-down direction is higher than the height of the first component 24 in the up-down direction. The first conductor member 34 is disposed on each of the left and right of the first component 24*a*. The length of the plurality of first conductor members 34 in the up-down direction is longer than the height of the first component 24*a* in the up-down direction. Due to this, two first conductor members 34 can be brought close to the first component 24*a*. Therefore, the shortest distance between the second conductor member 30 and the second component 26 is shorter than the shortest distance between the first conductor member 34 and the first component 24*a*. Due to this, components can be mounted at high density. The other structures of the circuit module 10*d* are the same as those of the circuit module 10, and thus description will be omitted. The circuit module 10*d* has the same functions and effects as those of the circuit module 10.

Fifth Modification

Figure 8:
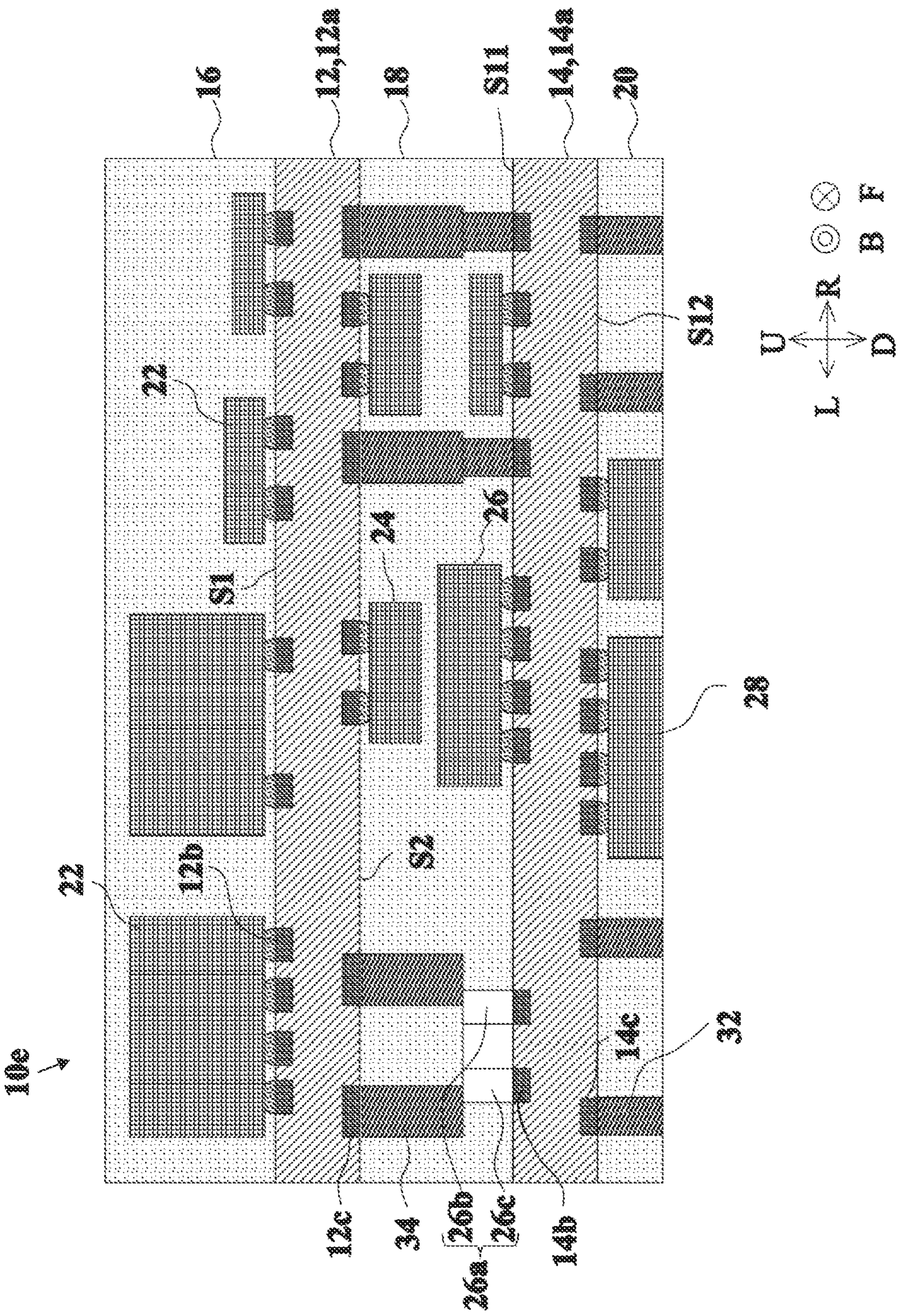
FIG. 8 is a cross-sectional view of a circuit module 10*e*.

Hereinafter, the circuit module 10*e* according to a fifth modification will be described with reference to the drawings. FIG. 8 is a cross-sectional view of a circuit module 10*e*.

The circuit module 10*e* is different from the circuit module 10 in further including a second component 26*a*. The second component 26*a* includes external electrodes 26*b* and 26*c*. The external electrodes 26*b* and 26*c* are mounted on the two mounting electrodes 14*b*. The two first conductor members 34 are connected to the external electrodes 26*b* and 26*c*. The other structures of the circuit module 10*e* are the same as those of the circuit module 10, and thus description will be omitted. The circuit module 10*e* has the same functions and effects as those of the circuit module 10.

Sixth Modification

Figure 9:
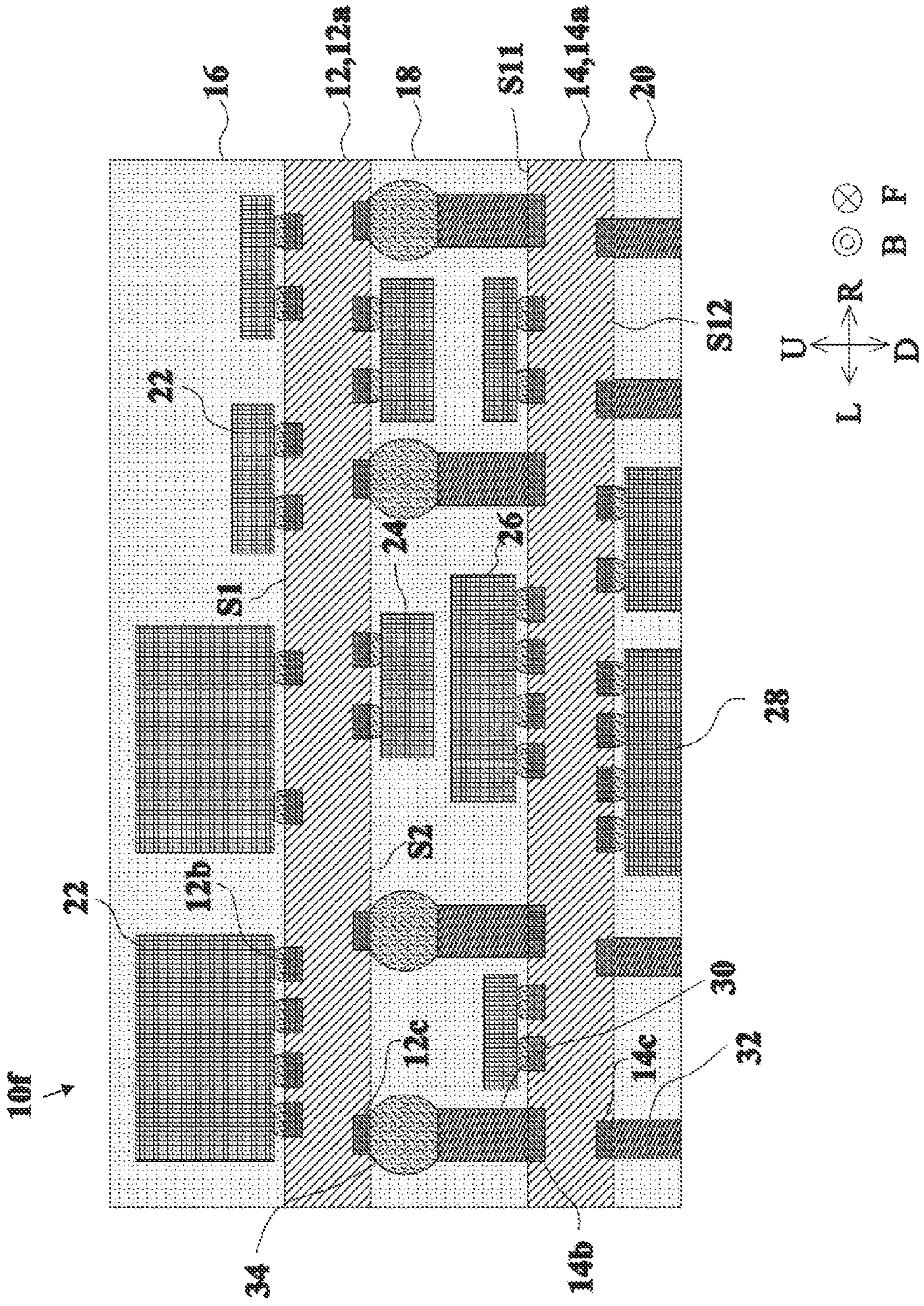
FIG. 9 is a cross-sectional view of a circuit module 10*f.*

Hereinafter, the circuit module 10*f* according to a sixth modification will be described with reference to the drawings. FIG. 9 is a cross-sectional view of a circuit module 10*f*.

The circuit module 10*f* is different from the circuit module 10 in that the first conductor member 34 is a solder bump. The solder bump has a spherical shape. The spherical shape also includes an ellipsoid. Therefore, in the solder bump, the position where the length has the maximum value in the orthogonal direction is below the upper end of the solder bump and above the lower end of the solder bump. In the present embodiment, the position where the length has the maximum value in the orthogonal direction is the center of the solder bump in the direction along the up-down axis. The other structures of the circuit module 10*f* are the same as those of the circuit module 10, and thus description will be omitted. The circuit module 10*f* has the same functions and effects as those of the circuit module 10.

OTHER EMBODIMENTS

The circuit module according to the present disclosure is not limited to the circuit modules 10 and 10*a* to 10*f*, and can be changed within the scope of the gist thereof. The structures of the circuit modules 10 and 10*a* to 10*f* may be arbitrarily combined.

The circuit modules 10 and 10*a* to 10*f* include the plurality of components 22. However, the circuit modules 10 and 10*a* to 10*f* only need to include one or more components 22. The circuit modules 10 and 10*a* to 10*f* include the plurality of first components 24. However, the circuit modules 10 and 10*a* to 10*f* only need to include one or more first components 24.

The circuit modules 10 and 10*a* to 10*f* include the plurality of second components 26. However, the circuit modules 10 and 10*a* to 10*f* only need to include one or more second components 26.

The circuit modules 10 and 10*a* to 10*f* include the plurality of components 28. However, the circuit modules 10 and 10*a* to 10*f* only need to include one or more components 28.

The circuit modules 10 and 10*a* to 10*f* include the plurality of first conductor members 34. However, the circuit modules 10 and 10*a* to 10*f* only need to include one or more first conductor members 34.

The circuit modules 10 and 10*a* to 10*f* include the plurality of second conductor members 30. However, the circuit modules 10 and 10*a* to 10*f* only need to include one or more second conductor members 30.

The circuit modules 10 and 10*a* to 10*f* include the plurality of third conductor members 32. However, the circuit modules 10 and 10*a* to 10*f* only need to include one or more third conductor members 32.

A shield member covering the front surface, the back surface, the left surface, the right surface, and the upper surface of the circuit module 10*f* may be provided.

The second component 26 is not an essential component. When the second component 26 is not provided, the first component 24 may be mounted on the second upper main surface S11.

In the circuit modules 10 and 10*a* to 10*f*, the plurality of third conductor members 32 may be mounted on the first upper main surface S1. In this case, the circuit board is arranged on the circuit modules 10 and 10*a* to 10*f*. The plurality of third conductor members 32 are mounted on the plurality of external electrodes of the circuit board.

The sealing resins 16, 18, and 20 are not essential components.

The present disclosure includes the following structure.

(1) A circuit module includes: an upper circuit board; a lower circuit board; a first conductor member; a second conductor member; and a first component, in which the upper circuit board has a first upper main surface and a first lower main surface, the lower circuit board has a second upper main surface and a second lower main surface, is disposed below the upper circuit board, and overlaps the upper circuit board as viewed in a downward direction, the first component is mounted on the first lower main surface or the second upper main surface, the first conductor member is a metal pin or a solder bump, and is connected to the first lower main surface, the second conductor member is a metal pin and is connected to the second upper main surface, the second conductor member is electrically connected to the first conductor member, and a length of the second conductor member in the up-down direction is longer than a maximum value of a length of the second conductor member in an orthogonal direction orthogonal to the up-down direction.

(2) The circuit module according to (1) further including a second component, in which the first component is mounted on the first lower main surface, and the second component is mounted on the second upper main surface.

(3) The circuit module according to (1) or (2) further including a sealing resin, in which the sealing resin covers the first lower main surface and the second upper main surface.

(4) The circuit module according to any of (1) to (3), in which the first conductor member is the solder bump, and a position where a length of the solder bump in the orthogonal direction has a maximum value is below an upper end of the solder bump and above a lower end of the solder bump.

(5) The circuit module according to any of (1) to (4), in which the first conductor member is a metal pin, and a length of the first conductor member in the up-down direction is longer than a maximum value of a length of the first conductor member in the orthogonal direction orthogonal to the up-down direction.

(6) The circuit module according to any of (1) to (5), in which a length of the first conductor member in the up-down direction is shorter than a length of the second conductor member in the up-down direction.

(7) The circuit module according to (2), in which a length of the second conductor member in the up-down direction is shorter than a length of the first conductor member in the up-down direction, and a shortest distance between the second conductor member and the second component is shorter than a shortest distance between the first conductor member and the first component.

What is claimed is:

1. A circuit module comprising:

an upper circuit board;

a lower circuit board;

a first conductor member;

a second conductor member;

a first component, and a sealing resin, wherein the upper circuit board has a first upper main surface and a first lower main surface, the lower circuit board has a second upper main surface and a second lower main surface, is disposed below the upper circuit board, and overlaps the upper circuit board as viewed in a downward direction of an up-down axis, the first component is mounted on the first lower main surface or the second upper main surface, the first conductor member is a metal pin or a solder bump, and is connected to the first lower main surface, the second conductor member is a metal pin and is connected to the second upper main surface, the second conductor member is electrically connected to the first conductor member, a length of the second conductor member in an up-down direction is longer than a maximum value of a length of the second conductor member in an orthogonal direction orthogonal to the up-down direction, wherein the up-down direction extends along the up-down axis, and the sealing resin covers the first lower main surface and the second upper main surface.

2. The circuit module according to claim 1, further comprising a second component, wherein the first component is mounted on the first lower main surface, and the second component is mounted on the second upper main surface.

3. The circuit module according to claim 2, wherein the length of the second conductor member in the up-down direction is shorter than a length of the first conductor member in the up-down direction, and a shortest distance between the second conductor member and the second component is shorter than a shortest distance between the first conductor member and the first component.

4. The circuit module according to claim 2, wherein the first conductor member is the solder bump, and a position where a length of the solder bump in the orthogonal direction has a maximum value is below an upper end of the solder bump and above a lower end of the solder bump.

5. The circuit module according to claim 2, wherein the first conductor member is a metal pin, and a length of the first conductor member in the up-down direction is longer than a maximum value of a length of the first conductor member in the orthogonal direction.

6. The circuit module according to claim 2, wherein a length of the first conductor member in the up-down direction is shorter than a length of the second conductor member in the up-down direction.

7. The circuit module according to claim 1, wherein the first conductor member is the solder bump, and a position where a length of the solder bump in the orthogonal direction has a maximum value is below an upper end of the solder bump and above a lower end of the solder bump.

8. The circuit module according to claim 1, wherein the first conductor member is a metal pin, and a length of the first conductor member in the up-down direction is longer than a maximum value of a length of the first conductor member in the orthogonal direction.

9. The circuit module according to claim 1, wherein a length of the first conductor member in the up-down direction is shorter than a length of the second conductor member in the up-down direction.

* * * * *